United States Patent [19]
Houston

[11] Patent Number: 5,084,873
[45] Date of Patent: Jan. 28, 1992

[54] CHIP ERROR DETECTOR

[75] Inventor: Theodore W. Houston, Richardson, Tex.

[73] Assignee: Texas Instruments Incorporated, Dallas, Tex.

[21] Appl. No.: 302,842

[22] Filed: Jan. 27, 1989

[51] Int. Cl.[5] .................. G11C 11/34; G06F 11/00
[52] U.S. Cl. .................. 371/4; 250/370.07; 250/370.14; 365/154
[58] Field of Search .......... 371/4; 250/370.01, 370.07, 250/370.14; 365/200, 201

[56] References Cited

U.S. PATENT DOCUMENTS

| | | | |
|---|---|---|---|
| 4,031,374 | 6/1977 | Groudan et al. | 371/40.2 |
| 4,130,892 | 12/1978 | Gunkel, II et al. | 365/156 |
| 4,413,327 | 11/1983 | Sabo et al. | 371/10.1 |
| 4,658,352 | 4/1987 | Nagasawa | 364/200 |
| 4,757,505 | 7/1988 | Marrington et al. | 371/66 |
| 4,805,148 | 2/1989 | Diehl-Nagle et al. | 365/154 |

*Primary Examiner*—Charles E. Atkinson
*Attorney, Agent, or Firm*—Stanton C. Braden; James T. Comfort; Melvin Sharp

[57] ABSTRACT

A memory cell system is disclosed with properties of asymmetrical operation such that the occurrence of memory error due to certain environmental disturbances is detectable. The asymmetry of operation can be adjusted to set the level at which the disturbance is detected. Detection of memory error in the system can be used to shut off access to an associated memory array in order to prevent error in the array.

3 Claims, 4 Drawing Sheets

CHIP ERROR DETECTOR

FIELD OF THE INVENTION

This invention is in the field of integrated circuits and is specifically directed to random access memories.

BACKGROUND OF THE INVENTION

Detection of conditions under which some information is apt to be lost can be of primary importance in the development of memory system such as those including static random access memories (SRAMs) or dynamic random access memories (DRAMs). Failure which causes a memory to store the wrong memory state may result, for instance, from the loss of memory power or from memory exposure over a period of time to accumulated radiation. Additionally, memory error may result from memory exposure to a pulse of gamma radiation (gamma dot).

It is desirable to have a memory system capable of detecting conditions that lead to memory error such that recovery procedures can be instituted. Furthermore, it is desirable to have a memory system capable of detecting an impending error causing situation such that memory error can be prevented.

Although detection schemes exist for various conditions, e.g. gamma dot detection, an on chip detector that can be closely matched to the failure levels of the actual circuit, and that could initiate prompt on chip corrective/preventive action could be beneficial.

OBJECTS OF THE INVENTION

It is an object of the invention to provide a new and improved scheme for detection of conditions that may cause circuit failure.

It is another object of the invention to provide a new and improved scheme for the prevention of memory error.

SUMMARY OF THE INVENTION

The foregoing objects of the invention are accomplished through the use of a memory cell which can be set to store an unfavored voltage state. Upon the occurrence of a predetermined level of a disturbance such as gamma dot, accumulated radiation, or the loss of memory cell power, the memory cell changes states and holds a favored voltage state.

In a first preferred embodiment of the invention, the favored state results from circuitry comprising a predetermined number of dummy memory cells which are hard-wired so as to store the favored state. In connection with the disturbance, pass transistors allow the transfer of the favored state to the memory cell.

In a second preferred embodiment of the invention, a p-channel transistor with its gate tied to its source provides the origin of the favored voltage state.

In a third preferred embodiment of the invention, a n-channel transistor with its gate tied to its source provides the origin of the unfavored voltage state.

In fourth and fifth preferred embodiments of the invention, a series of gate to source tied n-channel or p-channel transistors respectively are connected to a memory cell. Each transistor is separable from the next in the series by a fuse. Thus, fuse trimmable detection devices are provided that are capable selecting the level at which disturbance detection occurs.

In a sixth preferred embodiment of the invention, capacitors have been substituted in place of dummy cells. This embodiment of the invention is capable of indicating a loss of power situation for the detection circuit and its associated memory array.

DETAILED DESCRIPTION OF THE INVENTION

The invention is used in connection with an associated memory array in order to detect the occurrence of error in the array or the high likelihood of impending error in the array.

The invention uses a detection memory cell as a transient dose detector by introducing some asymmetry so that the cell has a favored state. On set (or re-set), a WRITE into the cell places the detection memory cell in an unfavored state. Under sufficient radiation effects or power down situations, the detection memory cell switches to the favored state.

The asymmetry introduced to the cell must be such that the cell will change to the favored state at a transient dose level or accumulated radiation level that is approaching the level at which cells in the associated memory array may be upset or at which associated circuitry will fail. One way to do this is to introduce an asymmetry on the bit lines of the detector cell that matches the worst case asymmetry in the memory array, i.e. n-1 memory cells with a voltage state opposite to the set state of the detection memory cell, where n is the number of rows in the memory array. In addition to the cell loading, the bit lines should be loaded the same as in the actual memory array, for example, being held in precharge when the chip is not enabled.

Figure 1:
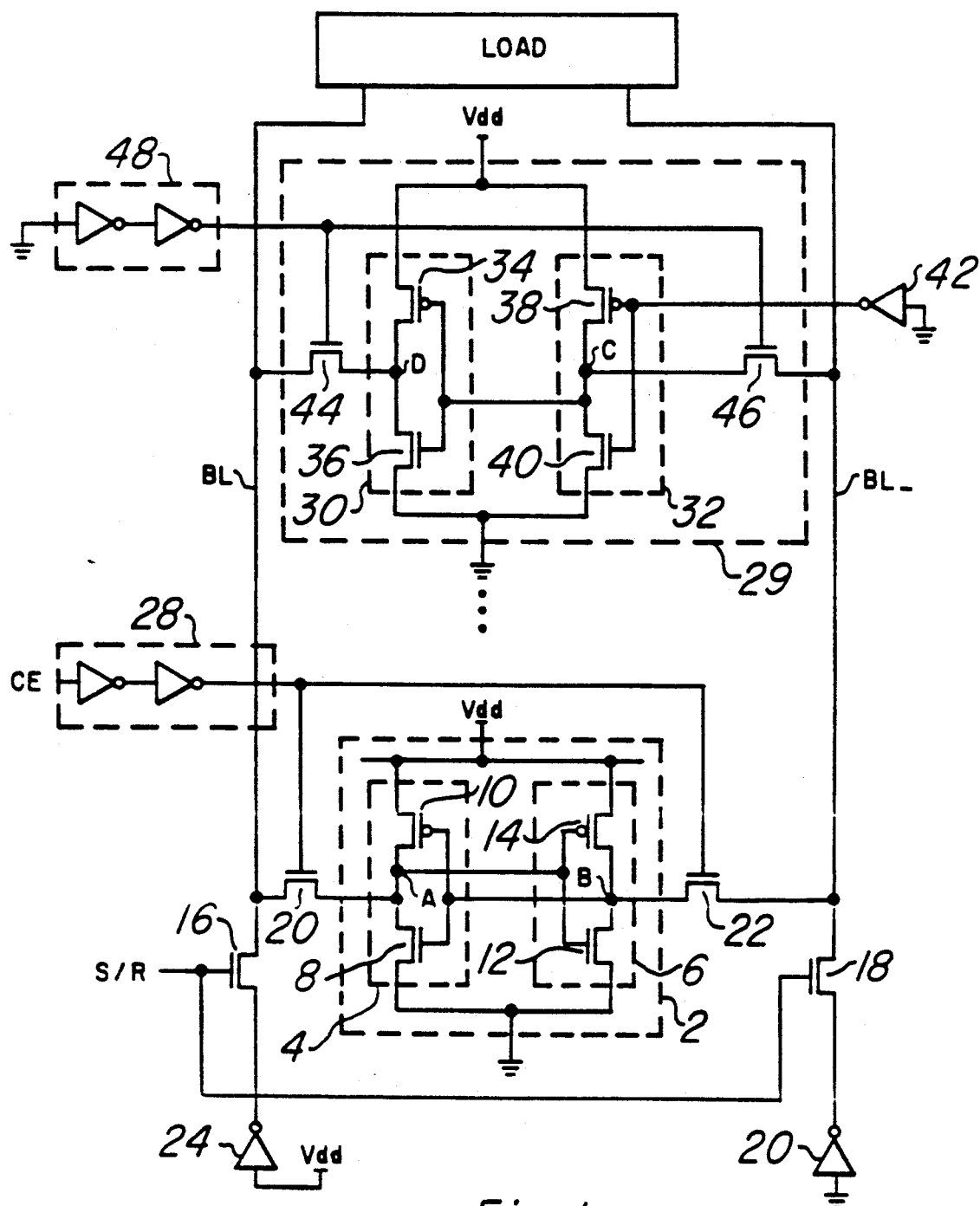
FIG. 1 is a schematic drawing which illustrates a first preferred embodiment of the invention.

FIG. 1 illustrates a first preferred embodiment of the invention. Dummy column generally referenced by numeral 1 need not be part of the memory array. Transient dose, accumulated radiation or power off situations can be sensed at any time independent of the array addressing/sensing. Detection memory cell 2 comprises inverters 4 and 6 which are cross-coupled such that the output of one is connected to the input of the other. Inverter 4 comprises n-channel transistor 8 and p-channel transistor 10 while inverter 5 comprises n-channel transistor 12 and p-channel transistor 14. Memory cell 2 is connected to voltage Vdd and circuit ground. Note, however, a voltage higher than circuit ground which is lower than Vdd could be substituted for the circuit ground of cell 2.

Node A forms the output of inverter 4 and node B forms the output of inverter 5. A high voltage relative to the voltage at node A is placed on node B. This shall be referred to as the unfavored voltage state for memory cell 2. A set/reset signal S/R can gate n-channel transistors 16 and 18 so that signals can be transferred to the outputs at nodes A and B of inverters 4 and 6 respectively. Pass transistors 20 and 22, gated by a chip enable signal CE or other control signal through two series connected inverters 28, allow signals traveling through transistors 16 and 18 to reach nodes A and B respectively. The origin of the signal to node A is from voltage Vdd inverted through inverter 24. The origin of the signal to node B is from circuit ground inverter through inverter 26.

A state which shall be referred to as the favored state is stored in dummy memory cell 29 in order to introduce some asymmetry to cell 2. More than one dummy memory cell may be used. For instance, if the associated memory array contains n columns (n being an integer), n−1 dummy cells may be used. Alternatively, a smaller number of dummy cells may be used if the dummy cells are oversized in comparison with memory cell 2. Dummy memory cell 29 comprises two inverters 30 and 32. Inverter 30 comprises p-channel transistor 34 connected to n-channel transistor 36. Inverter 32 comprises p-channel transistor 38 connected to n-channel transistor 40. The input of inverter 30 is tied to the output of inverter 32, node C. The output of inverter 32 is hardwired to a low voltage level relative to the high voltage level received at its input through inverter 42 which inverts a circuit ground signal. Consequently, the output of inverter 30, node D, is placed at a high voltage relative to the output of inverter 32. The high voltage at the output of inverter 30 and the low voltage at the output of inverter 32 represents the unfavored stored state. N-channel pass transistors 44 and 46 allow passage of the favored state onto two bit lines BL and BL__. Transistors 44 and 46 are normally gated off by circuit ground (shown in this example as connected to two series connected inverters 48). However, upon the occurrence of the sufficient level of gamma dot or alternatively, radiation accumulated over a longer period of time (than that of gamma dot), transistors 44 and 46 become leaky (and conduct photo current in the gamma dot situation), thereby allowing the transfer of information from cell 29 to the bit lines. The favored state is thus transferred to memory cell 2 through transistors 20 and 22. Note that bit lines BL and BL__ are initially precharged to a predetermined level by circuitry included in the load (which may represent the associated memory array) which is connected to bit lines BL and BL as shown. In order to pull voltage down on bit lines properly in the accumulated radiation case, it is important that the pull-down current through the combination of transistors 46 be less than that of the pull-down current through transistor 20. Otherwise, a sense amplifier (also referred to as sense amp), not shown, connected to bit lines BL and/or BL__ detects the favored state properly indicating a failure condition even if the detection cell has not changed state. Circuitry can be added to have the sense amplifier send a signal through the usual memory array output. For the case of gamma dot, circuitry can be connected to the memory array to shut off access to the memory cells once the error situation on cell 2 has been detected. The shut off can prevent memory loss, since the memory is least vulnerable in standby, provided that detection time and shut off time are shorter than the time needed to latch a gamma dot produced memory state. Otherwise, information in the associated memory array can be ignored and recovery procedures instituted.

Different ways to prevent array access are possible depending on the memory architecture. For a block architecture, for example, a good way would be to have all blocks deselected by the detection signal. This signal would result in quickly shutting off word lines and would initiate precharge/equalization of all bit lines, thus putting the memory array in its most stable state.

A loss of power can also be detected by memory cell 2. A high set/reset signal S/R only turns on to establish the unfavored state on memory cell 2. Once the state is established, signal S/R is turned off. A power loss can disturb the voltage originally established on memory cell 2. Upon restoration of power, the favored state will appear at nodes A and B. The sense amp will detect this change and appropriate action such as ignoring information in the associated memory array can be taken.

Another way to introduce asymmetry to the detection memory cell is by adding an "off-transistor", i.e. a transistor with its gate tied to its source. This will add minimal asymmetry under normal conditions and adds asymmetry under transient dose. Varying the size of the "off device" will vary the transient dose level at which the cell will flip from the unfavored state to the favored state.

Figure 2:
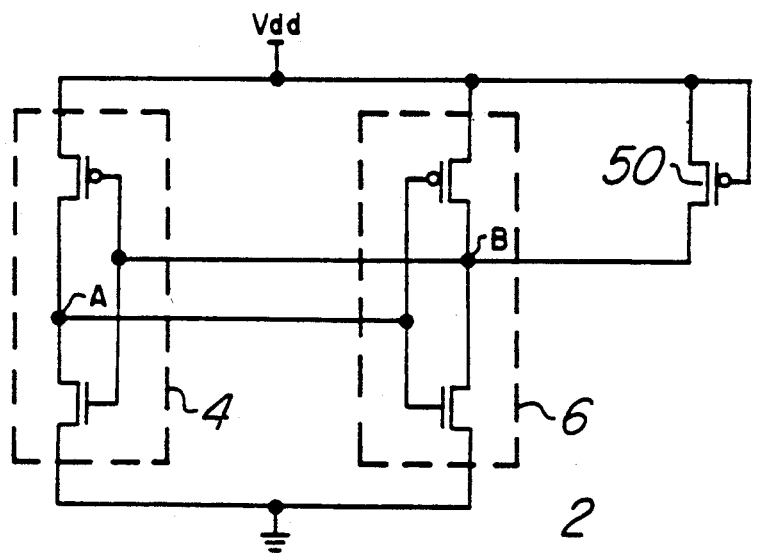
FIG. 2 is a schematic drawing which illustrates a second preferred embodiment of the invention.

A second preferred embodiment of the invention is illustrated in the schematic drawing of FIG. 2. This embodiment is similar to that shown in FIG. 1 except that p-channel transistor 50, with its gate tied to its source and its drain connected to node B, provides the unfavored state. For the example of the invention shown in FIG. 2, the unfavored state originally established is one with node A higher in voltage than node B. Upon the occurrence of transient dose radiation (gamma dot) or accumulated radiation, transistor 50 tends to make node B higher in voltage than node A. Thus a detectable favored state on cell 2 is established. The power loss favored state is similarly detected as in the circuit of FIG. 1.

Figure 3:
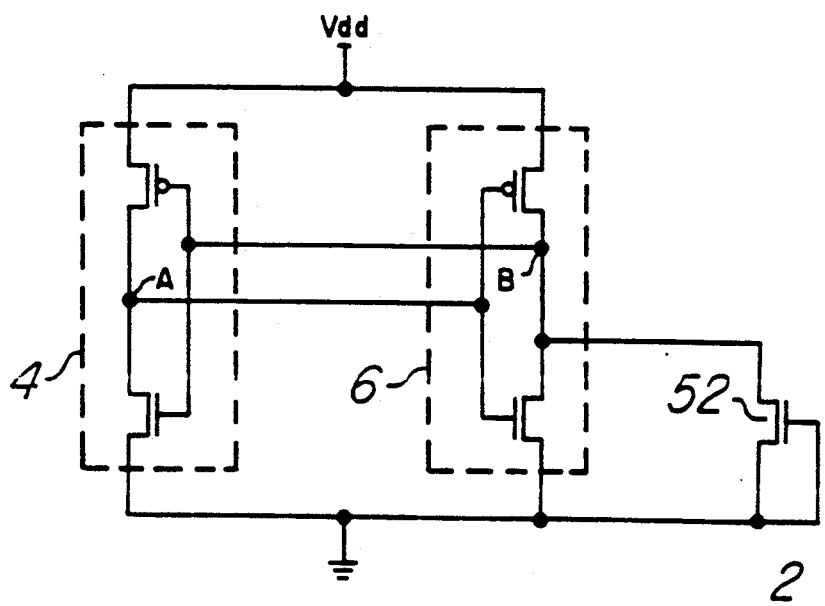
FIG. 3 is a schematic drawing which illustrates a third preferred embodiments of the invention.

FIG. 3 illustrates a schematic drawing of a third preferred embodiment of the invention. This embodiment is similar to that shown in FIG. 1 except that n-channel transistor 52, with its gate tied to its source and its drain connected to node B provides the favored state. For the example of the invention shown in FIG. 3, the unfavored state originally established is one with node B higher in voltage than node A. Upon the occurrence of transistor dose radiation or accumulated radiation, transistor 52 tends to make node B lower in voltage than node A. Thus a detectable favored state on cell 2 is established. The power loss favored state is similarly detected as in the circuit of FIG. 1.

Figure 4:
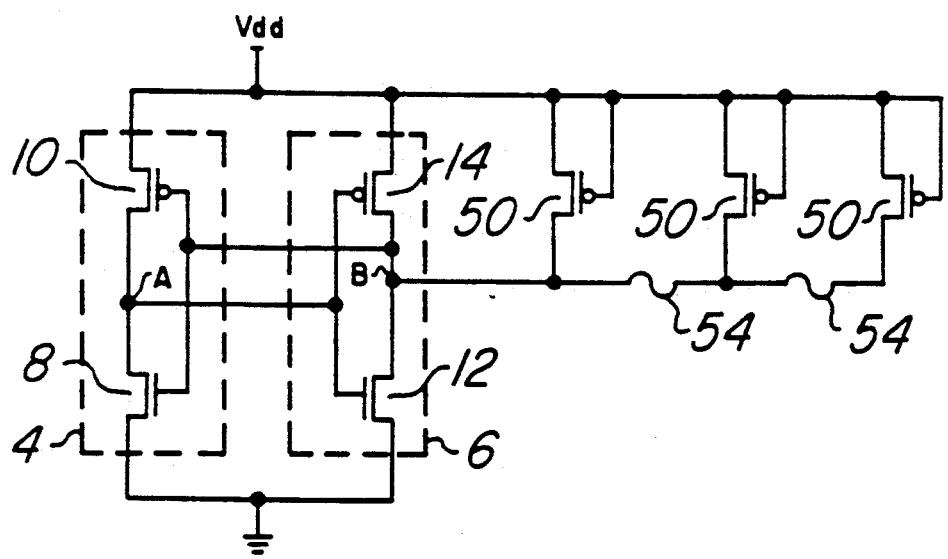
FIG. 4 is a schematic drawing which illustrates a fourth preferred embodiment of the invention.
Figure 5:
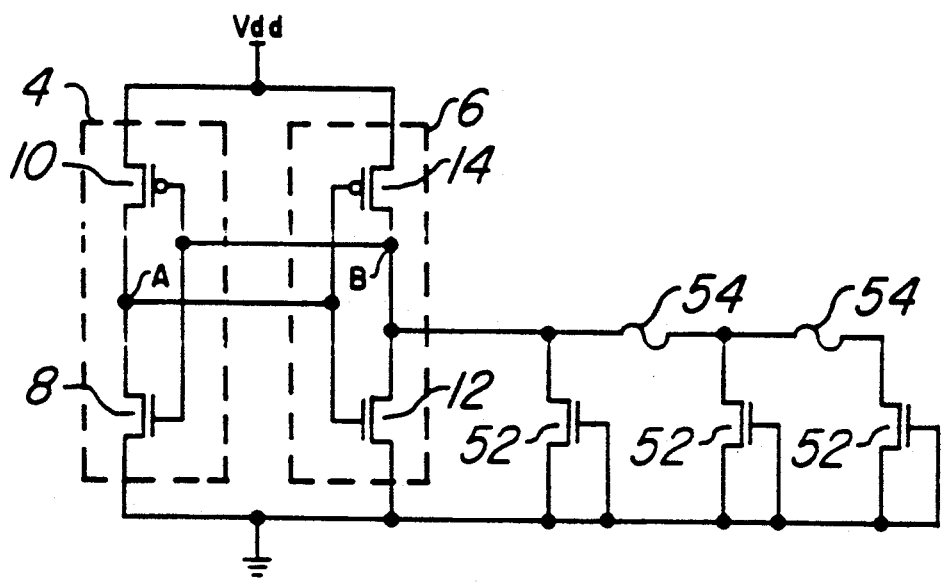
FIG. 5 is a schematic drawing which illustrates a fifth preferred embodiment of the invention.

The level of gamma dot or accumulated radiation for tripping the detection memory cell can be set by the amount of asymmetry in the detection memory cell. FIGS. 4 and 5 illustrate fourth and fifth preferred embodiments of the invention respectively. In FIG. 4, fuses 54 separate each transistor 50 of a series of transistors 50 connected in parallel. Similarly in FIG. 5 fuses 54 separate each transistor 52 connected in parallel. The circuits in FIGS. 4 and 5 operate similarly to those circuits shown in FIGS. 2 and 3 respectively, except that sensitivity to radiation is increased with an increasing number of transistors 50 for FIG. 4 and an increasing number of transistors 52 for FIG. 5. Fuses 54 can be blown (trimmed) so as to disconnect the desired number of parallel transistors in order to adjust radiation detection sensitivity to suit a particular application. Laser trimmable fuses, for instance, can be used.

Figure 6:
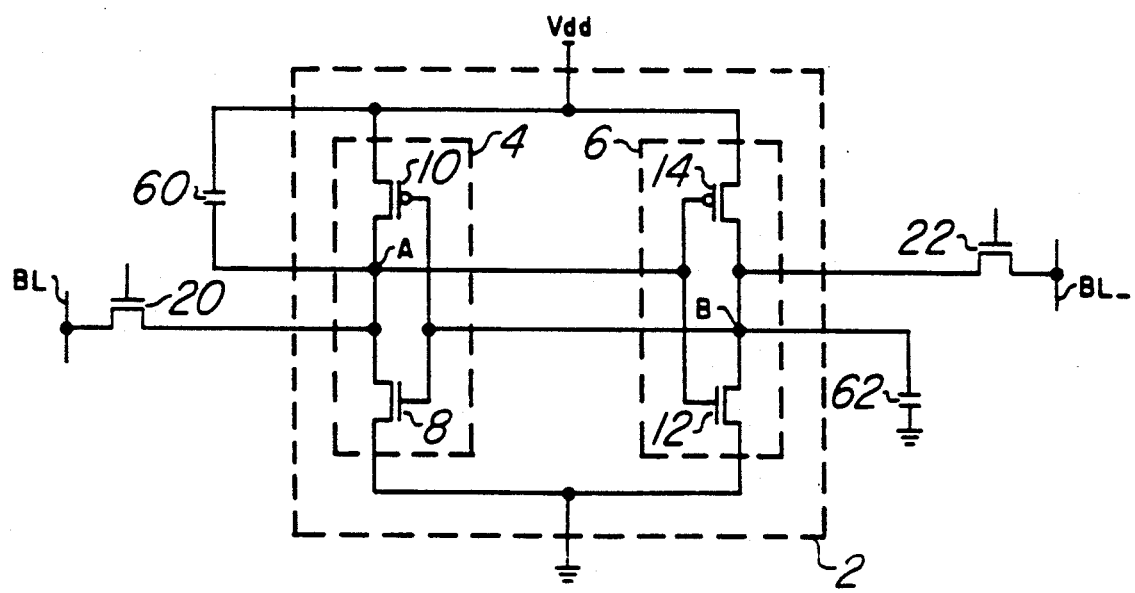
FIG. 6 is a schematic drawing which illustrates a sixth preferred embodiment of the invention.

FIG. 6 represents a schematic drawing of a sixth preferred embodiment of the invention. This embodiment is similar to the embodiment shown in FIG. 1 except that dummy cells are no longer needed and that capacitors 60 and 62 have been added. Capacitor 60 is connected to and between voltage Vdd and node A while capacitor 62 is connected to and between node B and circuit ground. An unfavored state is initially written to detection memory cell 2 by circuitry (not shown) similar to that illustrated in FIG. 1. In a power down situation, voltage drains from all nodes in cell 2. Once power returns, capacitors 60 and 62 force the voltage to the opposite, favored, state in cell 2. Thus, a sense amplifier (not shown) connected to either or both bit lines can detect the favored state which in this case is indicative of an instance of power loss. Note also that capacitors 60 and 62 can be added in like manner to the circuit shown in FIG. 1.

The foregoing described invention may be constructed according to many methods well known in the art of semiconductor fabrication.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. For example, a detection cell can be set up with sensitivity to threshold voltage shifts due to temperature fluctuations (either high or low). An embodiment is also contemplated wherein a differential amplifier detects the correlation of when the leakage current from unselected memory cells in the array is greater than the current from a selected memory cell in the array, as might happen in an instance of accumulated gamma radiation.

Additionally, note that p-channel transistors illustrated in the foregoing drawings can be substituted with n-channel transistors and vice versa. These transistors are for instance MOS transistors. Other types of inverters besides those shown in the foregoing drawings are also contemplated. Load transistors (shown as the p-channel transistors) in the inverters can for instance, be substituted with a resistor. Also, bipolar transistors can be substituted for the field effect transistors shown. It is contemplated that all such changes and additional embodiments are within the spirit and true scope of the invention as claimed below.

I claim:

1. A transient dose detection circuit comprising:
   a detection bi-stable circuit, including a memory cell, which is capable of storing a first logic state;
   circuitry operable for producing a second logic state in said detection bi-stable circuit in connection with the exposure of said transient dose detection circuit to sufficient levels of transient dose radiation; and
   a pair of bit lines connected to said memory cell, a favored state of said memory cell being caused by asymmetry on said bit lines.

2. A transient dose detection circuit as recited in claim 1 wherein the asymmetry on said bit lines substantially matches the worst case asymmetry in an associated memory array.

3. A transient dose detection circuit as recited in claim 1 wherein the asymmetry on said bit lines in adjustable relative to the worst case asymmetry in an associated memory array.

* * * * *